US011322275B2

(12) United States Patent
Nippani et al.

(10) Patent No.: US 11,322,275 B2
(45) Date of Patent: May 3, 2022

(54) FLAME RESISTANT DATA CABLES AND RELATED METHODS

(71) Applicant: COMTRAN CABLE LLC, Attleboro, MA (US)

(72) Inventors: Rama Krishna Nippani, Shrewsbury, MA (US); Paulette Blagburn, Putnam, CT (US); Eric Joseph O'Brien, Medford, MA (US); James Scott Conrad, Tolland, CT (US)

(73) Assignee: COMTRAN CABLE LLC, Attleboro, MA (US)

( * ) Notice: Subject to any disclaimer, the term of this patent is extended or adjusted under 35 U.S.C. 154(b) by 0 days.

(21) Appl. No.: 16/251,712

(22) Filed: Jan. 18, 2019

(65) Prior Publication Data
US 2020/0234850 A1 Jul. 23, 2020

(51) Int. Cl.
H01B 7/295 (2006.01)
H01B 7/02 (2006.01)
H05K 9/00 (2006.01)
H01B 11/10 (2006.01)
H01B 13/26 (2006.01)
H01B 13/00 (2006.01)
H01B 11/00 (2006.01)

(52) U.S. Cl.
CPC .......... *H01B 7/295* (2013.01); *H01B 7/0216* (2013.01); *H01B 11/002* (2013.01); *H01B 11/1025* (2013.01); *H01B 11/1091* (2013.01); *H01B 13/0036* (2013.01); *H01B 13/26* (2013.01); *H05K 9/0098* (2013.01)

(58) Field of Classification Search
CPC ................................ H01B 7/295; H01B 11/04
See application file for complete search history.

(56) References Cited

U.S. PATENT DOCUMENTS

| 7,550,676 | B2 | 6/2009 | Stutzman et al. |
| 7,696,437 | B2 * | 4/2010 | Clark ................... H01B 7/0216 174/110 R |
| 8,143,522 | B2 | 3/2012 | Laudenslager et al. |
| 8,420,939 | B2 | 4/2013 | Hernandez-Hernandez et al. |
| 8,546,693 | B2 | 10/2013 | Gromko et al. |
| 8,829,352 | B2 * | 9/2014 | Auvray ................. H01B 7/295 174/121 A |
| 9,201,204 | B2 | 12/2015 | Risch et al. |
| 9,251,930 | B1 | 2/2016 | McNutt |
| 9,390,838 | B2 | 7/2016 | Hopkinson et al. |
| 9,424,963 | B1 | 8/2016 | McNutt et al. |
| 9,520,210 | B1 * | 12/2016 | Neveux ............... G02B 6/4495 |
| 9,530,536 | B2 * | 12/2016 | Fujimoto ............... H01B 3/441 |
| 9,543,060 | B2 * | 1/2017 | Konnik ................. H01B 7/292 |
| 9,601,233 | B1 | 3/2017 | Kithuka et al. |

(Continued)

*Primary Examiner* — Chau N Nguyen
(74) *Attorney, Agent, or Firm* — Levenfeld Pearlstein, LLC

(57) ABSTRACT

A data cable is provided herewith, along with related methods. The disclosed data cables may meet the requirements for a UL 2196 flame test, including subsequent hose stream test. The disclosed data cables include two or more pairs of conductors wrapped with a flame-retardant tape and surrounded by low smoke zero halogen (LSZH) thermoset insulation. A shield may surround the conductor pairs and a non-halogen flame retardant polyolefin may surround the shield. In certain embodiments, the pairs of conductors present in the cable may have different lay lengths.

13 Claims, 3 Drawing Sheets

(56) References Cited

U.S. PATENT DOCUMENTS

| | | | |
|---|---|---|---|
| 9,640,301 B2* | 5/2017 | Kibe | H01B 3/421 |
| 9,690,062 B2 | 6/2017 | Hurley et al. | |
| 9,728,302 B1 | 8/2017 | McNutt | |
| 9,734,940 B1 | 8/2017 | McNutt et al. | |
| 9,773,585 B1 | 9/2017 | Rogers | |
| 9,784,935 B2 | 10/2017 | Bringuier et al. | |
| 9,928,943 B1 | 3/2018 | McNutt et al. | |
| 9,972,422 B1 | 5/2018 | Sekhavat et al. | |
| 10,121,571 B1 | 11/2018 | McNutt et al. | |
| 2002/0117325 A1 | 8/2002 | Mennone et al. | |
| 2005/0006132 A1* | 1/2005 | Clark | H01B 7/184 |
| | | | 174/113 C |
| 2005/0056454 A1* | 3/2005 | Clark | H01B 11/02 |
| | | | 174/113 R |
| 2015/0129277 A1* | 5/2015 | Siripurapu | H01B 3/30 |
| | | | 174/103 |
| 2015/0371737 A1* | 12/2015 | Bopp | H01B 11/08 |
| | | | 174/34 |
| 2016/0329129 A1 | 11/2016 | Osborne, Jr. et al. | |
| 2019/0068020 A1* | 2/2019 | Knerr | H02K 3/04 |

\* cited by examiner

FLAME RESISTANT DATA CABLES AND RELATED METHODS

FIELD OF THE DISCLOSURE

The present disclosure is generally related to insulated cables and, more particularly, is related to flame resistant data cables as well as related methods of manufacture and use.

BACKGROUND OF THE DISCLOSURE

Elongated cables are used for various applications in many industries. Cables may be required to meet strict safety standards for use in certain applications. For example, cables used for fire alarm systems must be able to resist flame temperatures, water spray exposure, and mechanical vibration to ensure the related circuitry systems remain intact for a defined period of time during a fire. The UL 2196 test for circuit integrity is used to evaluate the integrity of various types of cables, including data cables, for the ability to maintain circuit integrity when subjected to standardized fire test conditions and associated hose stream testing. The disclosed data cables may, in some embodiments, exhibit compliance with this and possibly other standards relating to fire resistance.

SUMMARY OF THE DISCLOSURE

The present disclosure relates to data cables. As used herein the term "data cable(s)" refers to any type of cable capable of transmitting data, including network cables, ethernet cables, coaxial cables, telecommunications cables, USB cables, or other types of cables. The disclosed data cables may meet the requirements for a UL 2196 flame test, including subsequent hose stream test. The disclosed data cables include two or more pairs of conductors, with each pair of conductors wrapped with flame retardant tape and surrounded by low smoke zero halogen (LSZH) thermoset insulation. A shield (e.g., a shield formed of a metal and polymer) is positioned outside the conductor pairs and a jacket formed of a non-halogen flame retardant polyolefin surrounds the shield.

In certain embodiments, the pairs of conductors present in the cable may have different lay lengths. In other words, each pair of conductors may be twisted to a different degree so that each pair of conductors has a distinct lay length as compared to the other conductor pairs present within the cable. For example, in an exemplary cable having two pairs of conductors (e.g., 18 AWG conductors), one pair of conductors may have a lay length of approximately 4.00 inches and the other pair of conductors may have a lay length of approximately 4.50 inches. In an exemplary cable having four pairs of conductors, the pairs of conductors may have the following approximate lay lengths: 3.00 inches, 3.50 inches, 4.00 inches, and 4.50 inches.

The presently disclosed cables can be manufactured by any suitable method. For example, in some embodiments, a first pair of conductors is arranged to have a first lay length and a second pair of conductors is arranged to have a second lay length that may be equal or unequal to the first lay length. If desired, additional pairs of conductors may also optionally be arranged in the cable to each have a particular lay length. A shield may then be helically wound around all pairs of conductors present. The shield may provide an overlap of at least 20%, in some embodiments. If desired, an outer jacket may then be applied around the shield using extrusion techniques or other suitable application methods.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

The present disclosure relates to data cables having two or more pairs of conductors. In some cases, the disclosed data cables may exhibit flame resistance, making the cables particularly useful for applications in which maintaining circuit integrity during fire and firefighting efforts is important. As discussed in additional detail below, the disclosed data cables include two or more pairs of conductors. Each pairs of conductors is wrapped with flame retardant tape and surrounded by low smoke zero halogen (LSZH) thermoset insulation. A shield is positioned outside the conductor pairs and an outer jacket formed of a non-halogen flame retardant polyolefin surrounds the shield.

Figure 1:
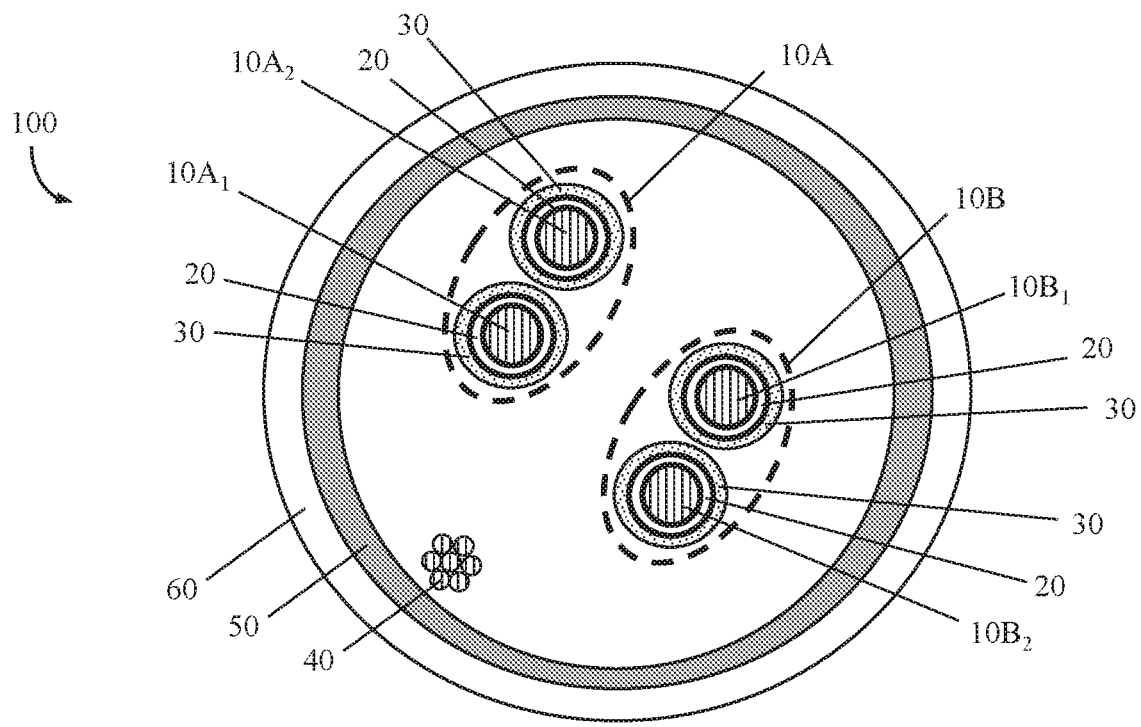
FIG. 1 is an illustration of a cross-sectional view of an exemplary data cable having two pairs of conductors, in accordance with some embodiments of the present disclosure.

FIG. 1 illustrates a cross-sectional view of an exemplary data cable 100 configured in accordance with the subject disclosure. As shown in FIG. 1, cable 100 includes a first pair of conductors 10A and a second pair of conductors 10B. Throughout the present disclosure, various conductors are referenced. For purposes of clarity, when reference is made to a conductor in general, the reference numeral '10' may be used and will be understood to apply to one or more of the following conductors shown in FIGS. 1-3: $10A_1$, $10A_2$, $10B_1$, $10B_2$, $10C_1$, $10C_2$, $10D_1$, and/or $10D_2$.

FIG. 1 illustrates a first pair of conductors 10A, which includes two conductors $10A_1$, $10A_2$. Conductors $10A_1$ and $10A_2$ (as well as any other conductors described herein) may be implemented with any desired type of conducting material. As will be appreciated, conductors 10 may have a substantially elongated structure and a length dimension that substantially exceeds a width or diameter dimension, as is common with cables and wires. In some embodiments, conductor 10 may be capable of powering a device or facilitating a communication or control signal between devices. Conductors 10 may be formed of any material capable of facilitating movement of electric charges, light, or any other communication medium. In some embodiments, conductors 10 may comprise one or more conductive materials such as copper, aluminum, alloys, fiber electric hybrid materials, fiber optical material or any other suitable material. In some embodiments, conductors 10 may be implemented with solid annealed copper or a plurality of electrical conductor wires. The conductors 10 may have be coated with a metal, such as tin or nickel, in some embodiments.

Conductors 10 may have any desired size, including 12 AWG, 14 AWG, 16 AWG, 18 AWG, 20 AWG, or 22 AWG. In select embodiments, the conductors 10 are formed of 18 AWG solid bare copper. In these and other embodiments, the solid bare copper may have a diameter of between 0.01 inches and 0.09 inches. Conductors 10 may each have a diameter of greater than, less than, or approximately equal to 0.040 inches, in some embodiments.

As shown in FIG. 1, in some embodiments, a tape 20 may be wrapped around the conductors $10A_1$, $10A_2$ within the first pair of conductors 10A. Tape 20 may be a flame-retardant tape, if desired. Tape 20 may be insulative, in some embodiments (i.e., tape 20 may prohibit the transmission of electrical energy from the conductor). Tape 20 may be implemented with any suitable polymeric material, such as an organic or inorganic polymer. In select embodiments, tape 20 is formed of one or more polyolefins. In some embodiments, tape 20 is a mica tape. In some embodiments, tape 20 comprises polyethylene (for example, LDPE or HDPE), polypropylene, polyvinyl chloride (PVC), polystyrene, nylon, polytetrafluoroethylene (PTFE), polyurethane, polyethylenimine (PEI), PEI alloy, polyetheretherketone (PEEK), and/or polyimide. In these and other embodiments, tape 20 is formed of a homopolymer (a single type of polymer) or a copolymer (two distinct types of polymers). In select embodiments, tape 20 may be formed of a silicone elastomer. The polymer(s) of tape 20 may or may not be cross-linked. In some embodiments, tape 20 includes one or more non-polymeric additives (e.g., filler particles, pigment, stabilizers) while in other embodiments, tape 20 does not contain any non-polymeric additives.

It should be noted that although tape 20 is illustrated in FIG. 1, tape 20 is optional and may not be present in some embodiments of cable 100. As will be appreciated, if desired, the second pair of conductors 10B may also include tape 20 surrounding the conductors $10B_1$, $10B_2$ positioned therein.

As shown in FIG. 1, surrounding the conductors $10A_1$, $10A_2$ of the first pair of conductors 10A (and positioned external to tape 20, if present) is a layer of low smoke zero halogen (LSZH) insulation 30. Example LSZH insulations that may be used to implement LSZH insulation 30 include but are not limited to LSZH Thermoset Fire-Roc™ LSZH insulation. The LSZH insulation 30 may have any desired thickness and, in some embodiments, the LSZH insulation 30 has a thickness of between 0.01 inches and 0.06 inches.

As shown in FIG. 1, distinct layers of LSZH insulation 30 surround each conductor $10A_1$, $10A_2$ of the first pair of conductors. However, in other embodiments, a single, unitary layer of LSZH insulation 30 may surround both conductors $10A_1$, $10A_2$ present in the first pair of conductors 10A. Similarly, the second pair of conductors 10B may include distinct layers of LSZH insulation 30 wrapped around conductors $10B_1$, $10B_2$ or, in other embodiments, a unitary layer of LSZH insulation 30 may surround both conductors $10A_1$, $10A_2$ of the second pair of conductors 10B. Numerous configurations and variations are possible and within the scope of the present disclosure.

Cable 100 may also include a drain 40, as shown in FIG. 1. Drain 40 may, in some embodiments, be formed of a stranded or un-stranded copper wire. For example, in some embodiments, drain 40 may be implemented with an 18 AWG stranded bare copper wire. In other embodiments, however, drain 40 may be implemented with a copper material coated with tin or nickel.

Although not illustrated in FIG. 1, cable 100 may optionally include other inner jacketing materials, such as mica, ceramic, Nomex®, silica, or a combination thereof. Numerous configurations and variations are possible and contemplated herein.

Cable 100 also includes a shield 50, as shown in FIG. 1. Shield 50 may be implemented with a metal, such as copper or steel, in some embodiments. In these and other embodiments, shield 50 may also include a non-halogenated polymer, such as poly(ethylene terephthalate) (PET), polyester, polyamide, polyimides, polyethylene, and/or ethylene vinyl acetate (EVA) copolymers. In one particular embodiment, shield 50 is formed of copper and polyester. In select embodiments, shield 50 has a thickness of at least 0.001 inches. In these and other embodiments, shield 50 has a thickness of approximately 0.005 inches. In embodiments in which shield 50 is implemented by wrapping one or more materials around any underlying layers, shield 50 may be wrapped to provide at least 20% overlap.

Cable 100 also includes an outer jacket 60, as shown in FIG. 1. In some embodiments, outer jacket 60 may be formed of a polyolefin, such as a flame-retardant polyolefin. In select embodiments, outer jacket 60 is implemented with a non-halogen flame-retardant polyolefin. In some such embodiments, outer jacket 60 may include one or more of the following polymeric materials: polyethylene, ethylene-propylene copolymer, ethylene/1-octene copolymer, ethylene/1-butene copolymer, ethylene/styrene copolymer, ethylene/ethyl acrylate copolymer, and/or ethylene/methyl acrylate copolymer. In some embodiments, the non-halogen polyolefin forming outer jacket 60 includes one or more flame retardants, including magnesium hydroxide, aluminum hydroxide, alumina trihydrate, silicon gum, silicon oil, and/or metal oxides, such as antimony oxide, iron oxide(s), copper oxide(s), and/or zinc borate. Outer jacket 60 may have any desired thickness and, in some embodiments, outer jacket 60 has a thickness of between 0.01 and 0.10 inches.

Figure 2:
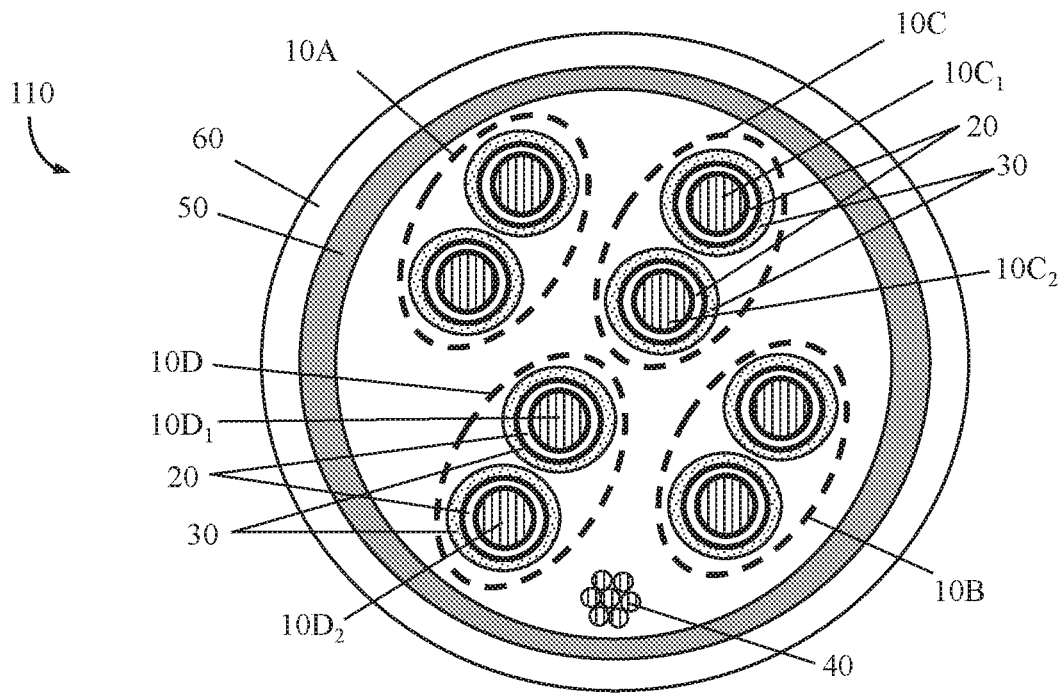
FIG. 2 is an illustration of a cross-sectional view of an exemplary data cable having four pairs of conductors, in accordance with some embodiments of the present disclosure.

Any number of pairs of conductors 10A, 10B may be included within cable 100. For example, FIG. 1 illustrates two pairs of conductors 10A, 10B, but cable 100 may include more pairs of conductors, such as three, four, five, six, seven, eight, nine, ten, twelve, fourteen, sixteen, eighteen, twenty, or more pairs of conductors. FIG. 2 illustrates an exemplary cable 110 having four pairs of conductors. As shown in FIG. 2, cable 110 includes a first pair of conductors 10A and a second pair of conductors 10B, as previously discussed, as well as a third pair of conductors 10C, and a fourth pair of conductors 10D. The third pair of conductors 10C includes a first conductor $10C_1$ and a second conductor $10C_2$, each surrounded by tape 20 and LSZH insulation 30, as previously described herein. The fourth pair of conductors 10D includes a first conductor $10D_1$ and a second conductor $10D_2$, each surrounded by tape 20 and LSZH insulation 30, as previously described herein.

Figure 3:
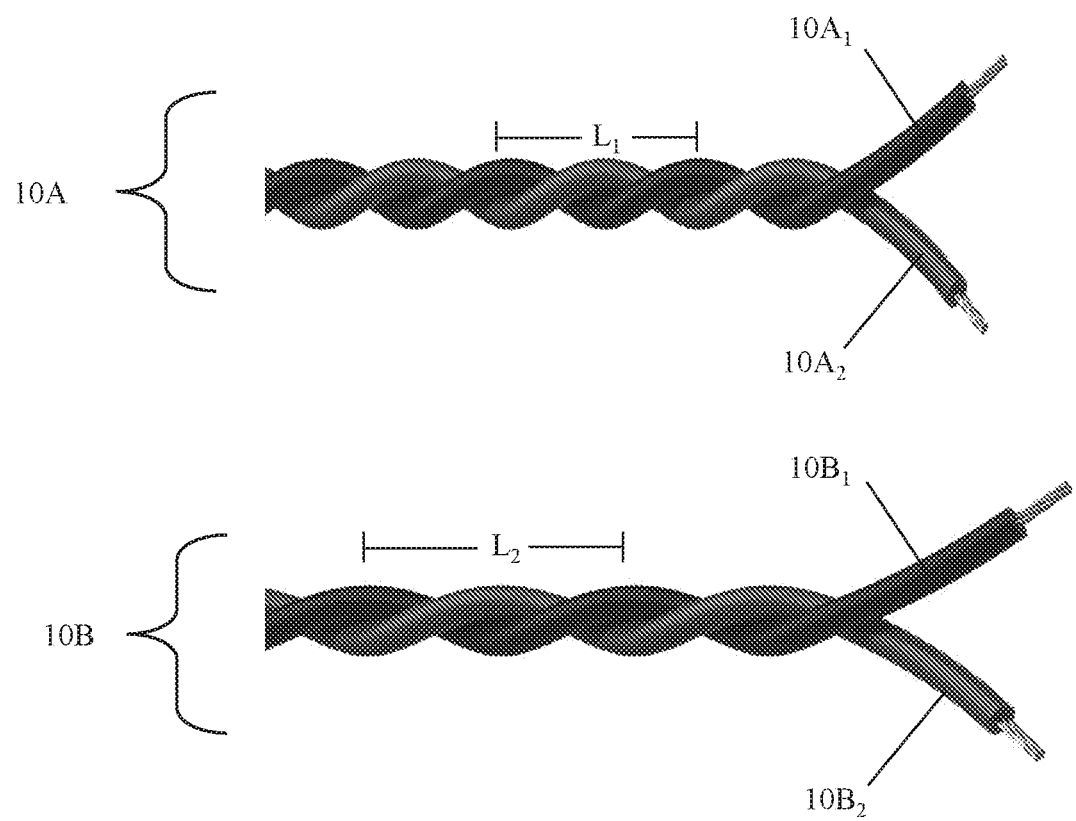
FIG. 3 is an illustration of a side view of exemplary conductor pairs that may be present within a data cable configured in accordance with the subject disclosure.

The pairs of conductors present in the cables as described herein may have any desired lay length. As used herein, the term 'lay length' refers to a length of cable required for the conductors present therein to make a full revolution. FIG. 3 illustrates a side view of exemplary pairs of conductors that may be present within a cable configured in accordance with the subject disclosure. FIG. 3 illustrates a first pair of conductors 10A, which includes conductor $10A_1$ and conductor $10A_2$ and a second pair of conductors 10B, which includes conductor $10B_1$ and conductor $10B_2$. As shown in FIG. 3, the lay length (L1) of the first pair of conductors 10A is unequal to (less than) the lay length (L2) of the second pair of conductors 10B. It should be noted, however, that in some cables, the lay length (L1) of the first pair of conductors 10A may be equal to or approximately equal to the lay length (L2) of the second pair of conductors 10B.

In some example embodiments, the lay length (L1) of the first pair of conductors 10A may be at least 0.25 inches greater than or less than the lay length (L2) of the second pair of conductors 10B. In these and other embodiments, the lay length (L1) of the first pair of conductors 10A may be at least 0.50 inches greater than or less than the lay length (L2) of the second pair of conductors 10B. In some such embodiments, the lay length (L1) of the first pair of conductors 10A may be approximately equal to 0.50 inches greater than or less than the lay length (L2) of the second pair of conductors 10B. For example, in some embodiments, the first pair of conductors may have a lay length (L1) of approximately 4.0 inches and the second pair of conductors may have a lay length (L2) of approximately 4.5 inches. Numerous configurations and variations are possible and contemplated herein. In embodiments in which more than two pairs of conductors are present, some or all pairs of conductors present in the cable may have different lay lengths. For example, in one particular embodiment, four pairs of conductor pairs are present and the conductor pairs have the following lay lengths: 3.0 inches, 3.5 inches, 4.0 inches, and 4.5 inches.

In addition to other possible features, the disclosed data cables may advantageously be able to provide circuit integrity throughout flame, fire, and/or water exposure. In particular, the disclosed data cables may meet the category 3 channel requirements per TIA-568-C.2 throughout UL2196 flame and hose stream testing. Also, in some embodiments, the disclosed cables may exhibit a maximum DC conductor resistance of 18.1 $\Omega$/1,000 feet. In addition to these electrical characteristics, the disclosed cables may also be capable of meeting one or more of the following compliance standards: (UL) listed type FPLR-LS, (UL) listed CL3R-LS, c(UL)us listed type CMR-LS and CMG-LS, CSA listed FAS105 FT4, UL subject 1424 power limited fire alarm circuits 300V/105° classified, UL subject 13 power limited circuit cables 300V/105° classified, UL subject 444 communications cable 300V/105° classified, ANSI/UL 2196 2-hour fire rating for use in FHIT system 40A, CAN/ULC-S139 2-hour fire rating with hose stream for use in FHIT7 system 40A, NFPA 70 & 72, California State fire marshal approved, and RoHS compliant.

As will be appreciated by those skilled in the art upon consideration of the subject disclosure, the presently described cables may advantageously be able to maintain circuit integrity during various conditions, including during fires and subsequent fire quenching activities. Advantageously, the presently disclosed cables may also meet stringent specifications for flame propagation, smoke density, halogen content, and toxicity to maximize safety in the event of a fire. Additionally, features of the disclosed cables, such as varied lay lengths of the conductor pairs, may reduce cross-talk, as well as provide increased cable flexibility and improved strength.

Figure 4:
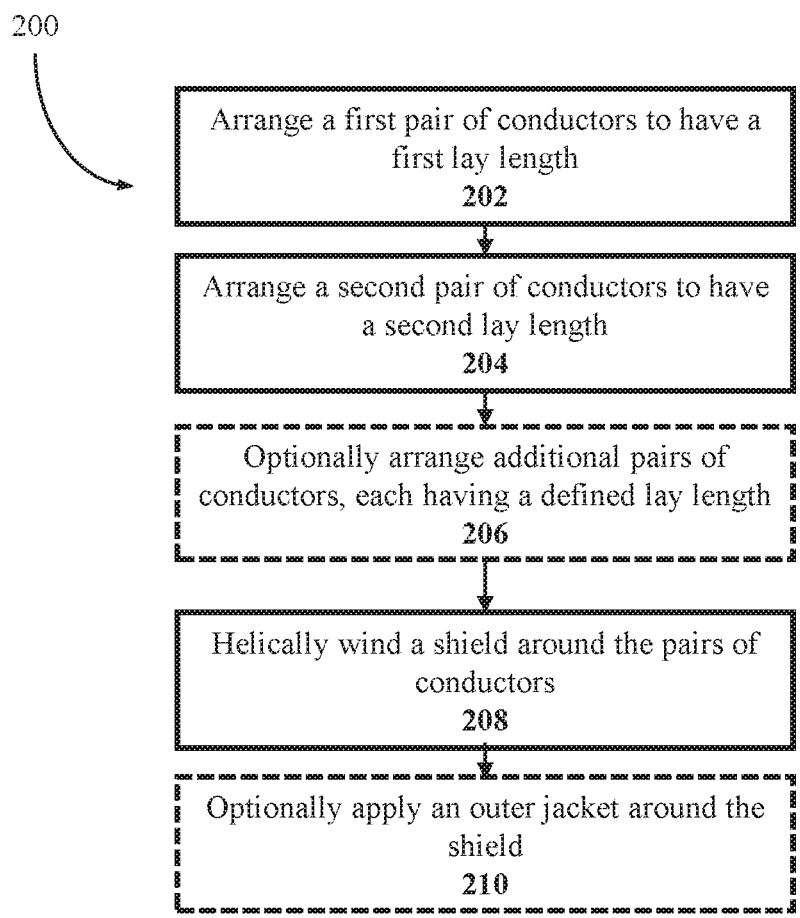
FIG. 4 is a flowchart illustrating an exemplary method of manufacturing a data cable having two or more pairs of conductors, in accordance with some exemplary embodiments of the present disclosure.

The presently disclosed cables may be produced by any suitable method. FIG. 4 is a flowchart illustrating an example method 200 of manufacturing a data cable, in accordance with some embodiments of the present disclosure. As shown in FIG. 4, method 200 includes arranging a first pair of conductors to have a first lay length (Block 202). The first pair of conductors referenced in Block 202 may have any features described herein with respect to the first pair of conductors 10A illustrated in FIG. 1. Method 200 continues with arranging a second pair of conductors to have a second lay length (Block 204). The second pair of conductors referenced in Block 204 may have any features described herein with respect to the second pair of conductors 10B illustrated in FIG. 1. Method 200 continues with optionally arranging additional pairs of conductors, each having a defined lay length (Block 206). Method 200 continues with helically winding a shield around the pairs of conductors (Block 208). The helically would shield may have any features discussed herein with respect to shield 50. In some embodiments, the shield may be helically wound to provide an overlap of at least 20%. Method 200 concludes with optionally applying an outer jacket around the shield (Block 210). The outer jacket applied around the shield may have any features or properties previously discussed with respect to outer jacket 60 of FIGS. 1 and 2. In some embodiments, the outer jacket may be extruded onto the shield, while in other embodiments, the outer jacket may be wrapped around the shield as a tape. Although not shown in FIG. 4, method 200 may also include any number of additional steps, processes, or functions, based on the desired features of the cable.

Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A cable comprising:
    a first pair of conductors comprising:
        a first conductor surrounded by a flame-retardant tape and an LSZH insulation; and
        a second conductor surrounded by a flame-retardant tape and an LSZH insulation, wherein the first pair of conductors has a first lay length;
    a second pair of conductors comprising:
        a first conductor surrounded by a flame-retardant tape and an LSZH insulation; and
        a second conductor surrounded by a flame-retardant tape and an LSZH insulation, wherein the second pair of conductors has a second lay length;
    a shield surrounding the first pair of conductors and the second pair of conductors; and
    an outer jacket surrounding the shield,
    wherein the flame-retardant tape is formed of a material selected from the group consisting of: mica, and a silicone elastomer, and
    wherein the first lay length is not equal to the second lay length, and wherein each pair of conductors has a lay length that is at least 0.25 inches greater than or less than each of the other pairs of conductors present in the cable,
    wherein the cable passes the requirements of UL 2196 fire exposure and hose stream test; and
    wherein the shield is implemented with a metal and a polymeric material.

2. The cable of claim 1, wherein the metal is copper.

3. The cable of claim 1, wherein the conductors are implemented with 18 AWG copper wire.

4. The cable of claim 1 further comprising a drain formed of a conductive material.

5. The cable of claim 1 further comprising a third pair of conductors and a fourth pair of conductors, wherein the third pair of conductors and the fourth pair of conductors each comprise:
   a first conductor surrounded by a flame-retardant tape and an LSZH insulation; and
   a second conductor surrounded by a flame-retardant tape and an LSZH insulation
   wherein the flame-retardant tape is formed of a material selected from the group consisting of: mica, and a silicone elastomer.

6. The cable of claim 1, wherein the LSZH insulation has a thickness of between 0.01 inches and 0.06 inches.

7. A cable comprising:
   a first pair of conductors comprising:
      a first conductor surrounded by a flame-retardant tape and LSZH insulation; and
      a second conductor surrounded by a flame-retardant tape and an LSZH insulation;
   a second pair of conductors comprising:
      a first conductor surrounded by a flame-retardant tape and LSZH insulation; and
      a second conductor surrounded by a flame-retardant tape and an LSZH insulation;
   a third pair of conductors comprising:
      a first conductor surrounded by a flame-retardant tape and LSZH insulation; and
      a second conductor surrounded by a flame-retardant tape and an LSZH insulation;
   a fourth pair of conductors comprising:
      a first conductor surrounded by a flame-retardant tape and LSZH insulation;
      a second conductor surrounded by a flame-retardant tape and an LSZH insulation;
   a shield surrounding the first pair of conductors, the second pair of conductors, the third pair of conductors, and the fourth pair of conductors; and
   an outer jacket surrounding the shield,
   wherein the flame-retardant tape is formed of a material selected from the group consisting of: mica, and a silicone elastomer, and
   wherein each pair of conductors has a lay length that is at least 0.25 inches greater than or less than each of the other pairs of conductors present in the cable,
   wherein the cable passes the requirements of UL 2196 fire exposure and hose stream test, and
   wherein the shield is implemented with a metal and a polymeric material.

8. The cable of claim 7, wherein each pair of conductors has a distinct lay length.

9. The cable of claim 7, wherein the metal is copper.

10. The cable of claim 7, wherein the conductors are implemented with 18 AWG copper wire.

11. A method of forming a data cable, the method comprising:
   arranging a first pair of conductors to have a first lay length, wherein the first pair of conductors includes a flame-retardant tape and LSZH insulation;
   arranging a second pair of conductors to have a second lay length that is unequal to the first lay length, wherein the second pair of conductors includes a flame-retardant tape and LSZH insulation; and
   helically winding a shield around the first pair of conductors and the second pair of conductors,
   wherein each pair of conductors is helically wound to have a lay length that is at least 0.25 inches greater than or less than each of the other pairs of conductors present in the cable, and
   wherein the flame-retardant tape is formed of a material selected from the group consisting of: mica, and a silicone elastomer,
   wherein the cable passes the requirements of UL 2196 fire exposure and hose stream test, and
   wherein the shield is implemented with a metal and a polymeric material.

12. The method of claim 11 further comprising arranging one or more additional pairs of conductors to each have a defined lay length and helically winding the shield around the additional pairs of conductors, the first pair of conductors, and the second pair of conductors.

13. The method of claim 11 further comprising applying an outer jacket around the shield.

* * * * *